(12) United States Patent
Paul et al.

(10) Patent No.: US 9,632,159 B2
(45) Date of Patent: Apr. 25, 2017

(54) AUTOMATED SPECTRAL FAT SATURATION

(71) Applicants: Dominik Paul, Bubenreuth (DE); Benjamin Schmitt, Nürnberg (DE)

(72) Inventors: Dominik Paul, Bubenreuth (DE); Benjamin Schmitt, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 702 days.

(21) Appl. No.: 13/969,206

(22) Filed: Aug. 16, 2013

(65) Prior Publication Data
US 2014/0049258 A1 Feb. 20, 2014

(30) Foreign Application Priority Data
Aug. 17, 2012 (DE) .................. 10 2012 214 660

(51) Int. Cl.
*G01R 33/56* (2006.01)
*G01R 33/48* (2006.01)
*G01R 33/54* (2006.01)

(52) U.S. Cl.
CPC ..... *G01R 33/4828* (2013.01); *G01R 33/5607* (2013.01); *G01R 33/546* (2013.01)

(58) Field of Classification Search
CPC .............. G01R 33/5607; G01R 33/546; G01R 33/4828
See application file for complete search history.

(56) References Cited

U.S. PATENT DOCUMENTS

| 5,429,134 A | 7/1995 | Foo |
| 7,265,548 B2 | 9/2007 | Böttcher |

(Continued)

FOREIGN PATENT DOCUMENTS

| CN | 1598556 A | 3/2005 |
| CN | 1751658 A | 3/2006 |

(Continued)

OTHER PUBLICATIONS

German Office Action dated Jul. 17, 2013 for corresponding German Patent Application No. DE 10 2012 214 660.1 with English translation.

(Continued)

*Primary Examiner* — Clayton E Laballe
*Assistant Examiner* — Ruifeng Pu
(74) *Attorney, Agent, or Firm* — Lempia Summerfield Katz LLC

(57) ABSTRACT

A method includes recording a magnetic resonance (MR) spectrum with the aid of a high frequency (HF) coil and a magnetic resonance tomography (MRT) device. A static magnetic field results in a recording volume of the MRT device. The method also includes an automatic analysis of the MR spectrum by searching for two resonant signals in the form of a fat peak, a water peak, and a minimum between the fat peak and the water peak. Such an automatic analysis is used for an automatic decision as a function of a predeterminable criterion, as to whether a series, including a plurality of acts, or a single act is performed. The homogeneity of the static magnetic field is adjusted with the aid of at least one shim coil of the MRT device, and an HF pulse is calculated for fat saturation as a function of the result of the search.

17 Claims, 3 Drawing Sheets

(56) References Cited

U.S. PATENT DOCUMENTS

| | | | |
|---|---|---|---|
| 7,639,009 B2 | 12/2009 | Hughes et al. | |
| 7,663,365 B2 | 2/2010 | Kanazawa | |
| 8,115,485 B1* | 2/2012 | Maier | G01R 33/543 |
| | | | 324/307 |
| 8,188,739 B2 | 5/2012 | Shirai et al. | |
| 8,324,896 B2 | 12/2012 | Baumgartl et al. | |
| 8,395,387 B2 | 3/2013 | Deimling | |
| 2005/0057250 A1 | 3/2005 | Asano | |
| 2006/0064004 A1 | 3/2006 | Machida | |
| 2006/0164082 A1 | 7/2006 | Foxall et al. | |
| 2006/0197526 A1 | 9/2006 | Weiger et al. | |
| 2006/0220643 A1 | 10/2006 | Bottcher | |
| 2008/0194944 A1* | 8/2008 | Edelman | A61B 5/055 |
| | | | 600/420 |
| 2008/0238421 A1* | 10/2008 | Kitane | G01R 33/4828 |
| | | | 324/307 |
| 2008/0315876 A1 | 12/2008 | Miyoshi | |
| 2009/0085566 A1 | 4/2009 | Kanazawa | |
| 2009/0091324 A1 | 4/2009 | Sugiura | |
| 2009/0174403 A1* | 7/2009 | Lu | G01R 33/243 |
| | | | 324/307 |
| 2010/0271023 A1 | 10/2010 | Deimling | |
| 2011/0227572 A1 | 9/2011 | Deshpande | |
| 2012/0119740 A1 | 5/2012 | Takahashi et al. | |
| 2012/0126813 A1* | 5/2012 | Paul | A61B 5/055 |
| | | | 324/309 |
| 2013/0088226 A1* | 4/2013 | Miyazaki | G01R 33/5607 |
| | | | 324/309 |
| 2013/0285658 A1* | 10/2013 | Zhao | G01R 33/4828 |
| | | | 324/309 |
| 2014/0028314 A1* | 1/2014 | Paul | G01R 33/387 |
| | | | 324/309 |
| 2015/0253411 A1* | 9/2015 | Umeda | G01R 33/56518 |
| | | | 324/318 |

FOREIGN PATENT DOCUMENTS

| | | |
|---|---|---|
| CN | 1820208 A | 8/2006 |
| CN | 1862282 A | 11/2006 |
| CN | 101327123 A | 12/2008 |
| CN | 101396265 A | 4/2009 |
| CN | 101401723 A | 4/2009 |
| CN | 102188245 A | 9/2011 |
| CN | 102639055 A | 8/2012 |
| DE | 10 2005 014 216 A1 | 10/2006 |
| DE | 60 2004 012 290 T2 | 3/2009 |
| DE | 602004012290 T2 | 3/2009 |
| DE | 10 2006 061 177 B4 | 4/2009 |
| DE | 10 2009 038 784 A1 | 3/2011 |
| DE | 10 2009 018 878 B4 | 3/2012 |
| EP | 1 662 270 B1 | 3/2008 |
| JP | H0360640 A | 3/1991 |
| JP | H08164121 A | 6/1996 |

OTHER PUBLICATIONS

Chinese office Action for related Chinese Application No. 201310350622.2 dated Feb. 3, 2016, with English Translation.

Schick, F. et al. Highly selective water and fat imaging applying multi slice sequences without sensitivity to B1 field inhomogeneities. MRM, 1997, 38, p. 269-274, 1997.

* cited by examiner

AUTOMATED SPECTRAL FAT SATURATION

This application claims the benefit of DE 10 2012 214 660.1, filed on Aug. 17, 2012, which is hereby incorporated by reference.

BACKGROUND

The present embodiments relate to automated spectral fat saturation.

Magnetic resonance tomography (MRT) is an imaging method that is used primarily in medical diagnostics. MRT uses a high and homogeneous static magnetic field (e.g., the $B_0$ field). With MRT, the relaxation times of nuclear spins in response to a high-frequency (HF) excitation pulse are observed (e.g., the longitudinal relaxation time $T_1$ and the transverse relaxation time $T_2$). In this process, the measurement of relaxation times of the hydrogen nucleus (i.e., a proton) is important due to prevalence in the human body. One challenge with MRT is to produce a clear contrast between fat tissue and aqueous tissue and, for example, to minimize disruptive influences of fat signals in aqueous tissue. Fat and water molecule signals may be separated due to the different chemical shift of both signals. Chemical shift refers to a shift of the resonant frequency of a nucleus as a function of the electrical and chemical environment. One method for suppressing fat signals based on the different chemical shift of hydrogen nuclei in fat tissue and aqueous tissue is known as spectral fat saturation. In a magnetic resonance (MR) spectrum, the resonances of hydrogen nuclei in fat and water molecules are manifested as separate signals in the form of a fat and water peak. A spectrally selective HF excitation pulse is then emitted, which only excites the hydrogen nuclei in the fat tissue so that longitudinal magnetization in the fat is converted to transverse magnetization. This is dephased immediately by a magnetic field gradient, so that the fat tissue may no longer be shown by the imaging sequence that directly follows. Spectral fat saturation is, however, susceptible to inhomogeneities of the $B_0$ field and the respective transverse relaxation times within the measurement volume, because these determine the position and width of the fat peak in the MR spectrum. This dependency therefore provides that the quality of fat signal suppression may be spatially distributed in an inhomogeneous manner. One possible way of adjusting the homogeneity of the $B_0$ field is referred to as shimming. Therefore, most MRT systems have shim coils that are able to correct even more complex spatial magnetic field patterns.

DE 10 2009 018 878 B4 discloses a method for imaging in magnetic resonance tomography using spectral fat saturation or spectral water excitation in a tissue region to be imaged of a patient to be examined. The method includes frequency adjustment measurement of a region of a patient to be displayed using a selected first coil section of the MRT system, and exact determination of the resonant frequency of water based on the spectrum obtained in the frequency adjustment measurement and including the resonant frequencies of fat and water. The method also includes repeating the frequency adjustment measurement and the determination using at least one further selected second coil section of the MRT system adjacent to the first coil section. The method includes measuring a k space dataset using a coil section or a coil section combination based on the water resonant frequency assigned to the coil sections. The method also includes repeating the measuring of the k space with other coil sections or other coil section combinations until the entire tissue region to be displayed has been measured. The method includes combining the measurement results obtained in the measuring of the k space and the repeating of the measuring, and displaying the result obtained in the combining in the image space in the form of an overall image of the tissue region to be displayed.

SUMMARY AND DESCRIPTION

The scope of the present invention is defined solely by the appended claims and is not affected to any degree by the statements within this summary.

The present embodiments may obviate one or more of the drawbacks or limitations in the related art. For example, spectral fat saturation for a magnetic resonance tomography (MRT) image recording method is improved to make the MRT image recording method less susceptible to inhomogeneities of the static $B_0$ field.

Features, advantages or alternative embodiments mentioned in the process may also be applied to the other descriptions. The description directed toward a system, for example, may also be developed with the features described in connection with a method. The corresponding functional features of the method may be formed by corresponding objective modules.

The method is based on the recording of an MR spectrum in act S with the aid of an HF coil and an MRT device. A static magnetic field $B_0$ prevails in the recording volume of the MRT device. The method is also based on an automatic analysis of the MR spectrum in act A by searching for two resonant frequencies in the form of a fat peak and a water peak (e.g., two peaks) and a minimum between the two peaks. One or more of the present embodiments are based on the idea of using such an automatic analysis for an automatic decision E, as a function of a predeterminable criterion, as to whether a series, including acts J, S, A and E, or act P is performed. Act J includes an adjustment of the homogeneity of the static magnetic field $B_0$ with the aid of at least one shim coil of the MRT device, and act P including the calculation of an HF pulse for fat saturation as a function of the result of the search in act A. The automatic decision E allows the separation of the fat peak and water peak, and therefore also the basis for calculation of the HF pulse for fat saturation, to be improved by a new adjustment of the homogeneity of the static magnetic field $B_0$. Increased homogeneity of the static magnetic field $B_0$ brings about improved separation of the fat peak and water peak in the MR spectrum. The series of acts J, S, A and E is repeated iteratively until a criterion is satisfied, and calculation of the HF pulse for fat saturation is initiated. A subsequent fat saturation with the aid of the calculated HF pulse for an MRT image recording method is therefore less susceptible to the original inhomogeneities of the static $B_0$ field.

In one embodiment, the criterion includes whether a characteristic value describing the MT spectrum is higher or lower than a threshold value, with the result that satisfaction of the criterion may be tested easily.

The recording of the MR spectrum with the aid of a local HF coil also has the advantage of an improved signal-to-noise ratio compared with a recording with the aid of a whole-body HF coil.

An adaptation of a mathematical function to the MR spectrum for the purpose of the automatic analysis of the MR spectrum has the advantage that characteristic properties of the MR spectrum such as the position and level of resonances may be determined particularly easily, as when the mathematical function is chosen appropriately, such characteristic properties emerge directly from the free parameters of the adapted mathematical function.

In a further embodiment, act A includes the sub act AL, creating a list containing the following information: spectral position of the water peak and fat peak and the minimum between the two peaks; characteristic width of the water peak and the fat peak in the MR spectrum; amplitude of the water peak and the fat peak in the MR spectrum.

Such a list represents a particularly economical representation of the analysis result and allows a number of MR spectra to be compared in a simple manner, as only the corresponding entries in different lists are to be compared to compare different MR spectra.

The criterion of whether at least one information item in the list is higher or lower than at least one threshold value is particularly simple to check and produces a clear result. Such a criterion may also be adapted particularly easily to specific requirements by simply changing the threshold value.

In a further embodiment, n series are executed, with act A including the sub act AV in the nth series. Sub act AV includes comparison of the MR spectrum in the nth series with the MR spectrum in the (n-1)th series by calculating at least one comparison value that relates at least one information item in the nth series list to at least one information item in the (n-1)th series list, thereby simplifying and therefore facilitating a comparison of MR spectra recorded in different series.

The predeterminable criterion of whether at least one comparison value is higher or lower than a threshold value has the advantage that it is simple to check and produces a clear result. Such a criterion may also be adapted easily to specific requirements by changing the threshold value.

The calculation of the HF pulse for fat saturation as a function of a minimum between the fat peak and the water peak in the MR spectrum allows the HF pulse to effectively saturate, almost exclusively, the fat signal in a subsequent MRT image recording method, even if an increasing overlaying of the fat and water peaks is observed due to a low level of spatial homogeneity.

A computer program product that may be called up into the internal memory (e.g., a non-transitory computer-readable storage medium) of a computer is provided. The computer program product includes a computer program for performing the acts of the method of one or more of the present embodiments, so that the acts of the method may be executed quickly and robustly in a manner that may be repeated identically.

A computer-readable medium, on which the computer program product (e.g., the computer program including instructions) is stored in an executable manner, is also provided. The computer-readable medium may be a non-transitory computer-readable storage medium. The instructions may be executable by one or more processors.

The method acts may also be executed by a system that is configured to execute the respective method acts. The system may be a system for automated spectral fat saturation and may include an MRT device and an HF coil that are configured to record an MR spectrum. The MRT device is configured to establish a static magnetic field $B_0$ in a recording volume. The system may also include at least one shim coil configured to adjust the homogeneity of a static magnetic field $B_0$ in the recording volume of the MRT device, a control unit configured to control the MRT device, the HF coil and at least one shim coil, and an analysis unit configured for the automatic analysis of the MR spectrum. The automatic analysis includes a search for at least two differentiable resonant frequencies in the form of a fat peak and a water peak and a minimum between the two peaks. The system includes a decision unit configured to make a decision as a function of a predeterminable criterion, and a calculation unit configured to calculate an HF pulse for fat saturation as a function of the search result.

DETAILED DESCRIPTION

Figure 1:
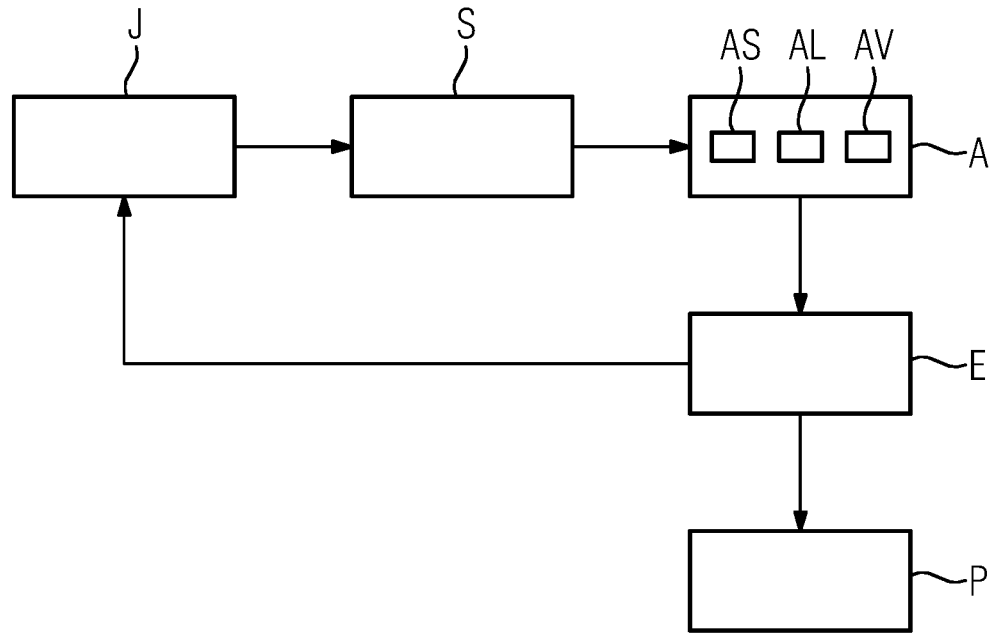
FIG. 1 shows a flow diagram of one embodiment of a method for automated spectral fat saturation.

FIG. 1 shows a flow diagram of one embodiment of a method for automated spectral fat saturation. Such a method is effective when the method is performed anew before each magnetic resonance tomography (MRT) image recording method, as the method serves to calculate a spectrally selective HF excitation pulse that is intended to reduce a contribution of hydrogen nuclei bound in fat tissue to a signal of an MRT image.

Spectral fat saturation is based on the differentiation of a fat peak 17 and a water peak 16. The fat peak 17 or the water peak 16 is the respective signal in a magnetic resonance (MR) spectrum 15 that results at a resonant frequency of hydrogen nuclei in fat tissue or aqueous tissue. The MR spectrum 15 refers to the plotting of a signal amplitude received by an HF coil 6 against a respective excitation frequency for a spectrum of excitation frequencies in the HF range or radio frequency range. Such an MR spectrum 15 is recorded in act S for the purpose of determining the fat peak 17 or the water peak 16 while the patient 5 or body part of the patient 5 to be examined is present in the recording volume 3 of the MRT device 1. A static magnetic field $B_0$ 7 prevails in the recording volume 3 in this process. The recording of such an MR spectrum 15 may not be spatially resolved. Therefore, magnetic gradient fields may not be used. There is simply the restriction to a specified body region of the patient 5 if a local HF coil 6 is used. Which recording mode is used for recording the MR spectrum 15 (i.e., whether a T1 or T2-weighted measurement is performed) may not be important. Measurement of such an MR spectrum 15 allows the water peak 16 and the fat peak 17 to be identified.

To identify the water peak 16 and the fat peak 17, in act A, the MR spectrum is analyzed automatically by first searching in act AS for at least two resonant frequencies in the form of a fat peak 17 and a water peak 16 and a minimum between the fat peak 17 and the water peak 16 (e.g., two peaks). "Automatically" may be that the act of the method is executed by machine (e.g., with the aid of a data processing unit 9 and a corresponding computer program product) directly following act S without further action on the part of an operator (of the MRT device 1 and/or the data processing unit 9).

The search for the resonant frequencies and a minimum may be implemented using known algorithms. The data of the MR spectrum 15 is filtered at the start of the analysis (e.g., using a Gaussian or Hamming window). In the embodiment described, the search includes an adaptation (e.g., fitting) of at least one mathematical function to the MT spectrum 15, for which a Gaussian function may be used as the fitting function to be adapted. The following values, which are used in the act AL, emerge directly from the fitting parameters (e.g., the values for the free parameters of the fitting function calculated as optimum (in the defined basic conditions)): spectral position of the water peak 16 and the fat peak 17 and a minimum between the two peaks in the MR spectrum 15; a characteristic width of the water peak 16 and the fat peak 17 in the MR spectrum 15; and an amplitude of the water peak 16 and the fat peak 17 in the MR spectrum 15 between the water peak 16 and the fat peak 17. These values are stored in a list in act AL. This act is also executed automatically.

If the acts S, AS and AL have been performed just once as preparation for calculating a spectrally selective HF excitation pulse for an MRT image recording method, then act E follows. Act E includes an automatic decision as to whether a series, including the act J, adjusting the homogeneity of the static magnetic field $B_0$ 7, and also including the acts S, A and E, is performed or whether act P, calculation of an HF pulse, is performed. The decision is a function of a predeterminable criterion. The predeterminable criterion includes a characteristic value describing the MR spectrum 15 (e.g., a value calculated in act AL and stored in a list) exceeding a threshold value. For example, it may be automatically decided in act E that act P is performed directly because the difference between the spectral positions of the fat peak 16 and the water peak 17 exceeds a threshold value. The criterion may also be, for example, the relationship between amplitude and characteristic width. The criterion may also be formulated such that the value is lower than a characteristic value. The criterion E may either be fixed beforehand, or the criterion E may be selected by the operator at the start of the method (e.g., indirectly by selecting a recording mode), as different expected inhomogeneities are linked to different recording modalities. Also, certain body regions of the patient 5 demonstrate greater differences in magnetic susceptibility than other body regions and have different concentration ratios of fat and water protons.

Figure 4:
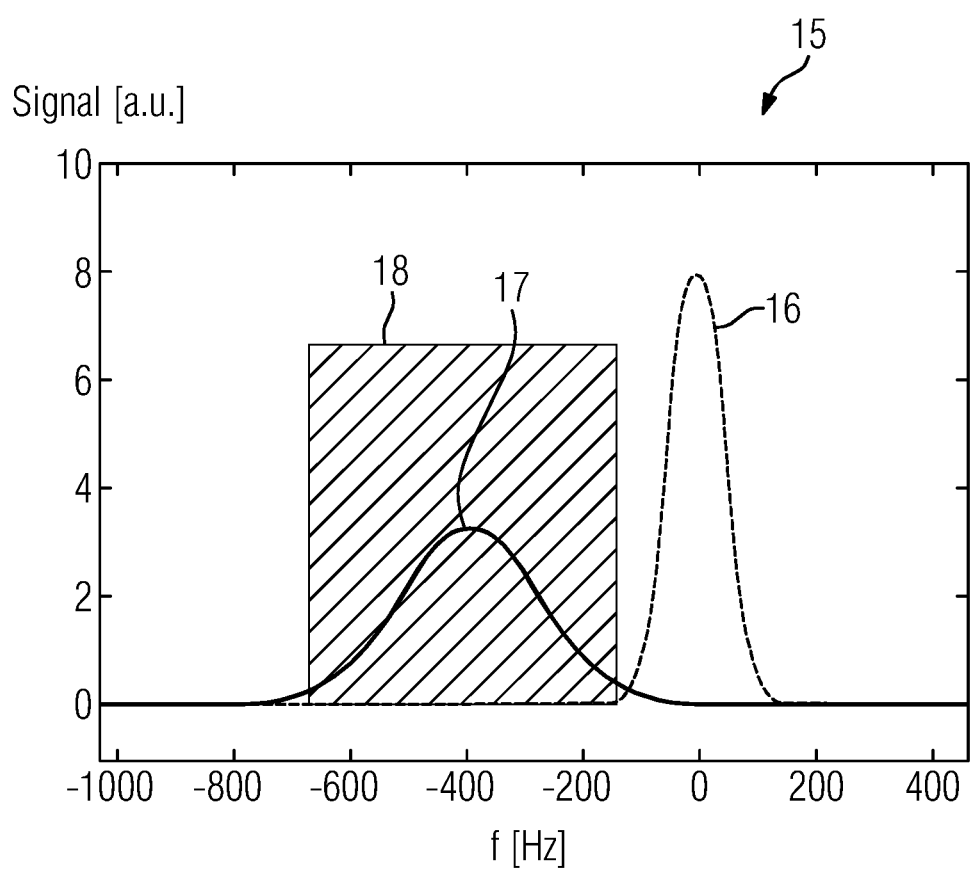
FIG. 4 shows an exemplary output of an MR spectrum.

Act P is the calculation of an HF pulse for fat saturation. This act is a direct function of act E, as it is decided here whether act P should be performed. Act P is also a function of act A, as the result of the analysis of the MR spectrum 15 influences the calculation of the HF pulse. The HF pulse may be calculated such that the HF pulse covers the fat peak 17 in the MR spectrum 15 and is therefore designed to saturate the fat peak 17. The HF pulse may also avoid unwanted saturation of the water peak 16. In contrast to standard calculation methods, therefore, the calculation of the HF pulse is not based on a fixed shift of the transmit frequency of the HF pulse in relation to the position of the water peak 16. Specifically, for example, a sinc pulse may be used as the HF pulse, a first zero crossing, which is shifted to higher frequencies relative to the central maximum, coinciding with a minimum between the fat peak 17 and the water peak 16. The calculation is not necessarily fully automatic. As shown in FIG. 4, the MR spectrum 15 may also be shown on the output unit so that the operator may select the region to be saturated using a selection window 18 around the fat peak 17 using a slider.

The alternative decision in act E is to continue with act J, the adjustment of the homogeneity of the static magnetic field $B_0$ 7 with the aid of shim coils 8 of the MRT device 1.

Act J may also be referred to as the shim procedure. To perform the shim procedure, the static magnetic field $B_0$ 7 in the recording volume 3 is first measured. The shim currents the shim coils 8 are to have for the static magnetic field $B_0$ 7 to be homogeneous are then calculated. A totally homogeneous static magnetic field $B_0$ 7 may not be achieved even after the performance of a shim procedure due to physical deviations of basic conditions that are to be assumed in order to calculate the shim currents. The adjusted and therefore improved homogeneity of the static magnetic field $B_0$ 7 may lead to an improvement in the separability of the fat peak 17 and the water peak 16, as inhomogeneities of the static magnetic field $B_0$ 7 may result in a smaller chemical shift and/or extension and increasing overlaying of the peaks so that the peaks overlap. It is not worth performing a number of shim procedures before recording an MR spectrum 15, as the shim procedures are very computation-intensive due to the measuring of the static magnetic field $B_0$ 7 and therefore take a long time. The method of one or more of the present embodiments provides that only the number of shim procedures to allow effective spectral fat saturation for the MRT image recording method is performed.

Following the adjustment J is act S, the recording of an MR spectrum 15, as well as act A, the analysis of the MR spectrum, with the sub-acts AS and AL. If the acts S, AS and AL have already been performed more than once as preparation for calculating a spectrally selective HF excitation pulse for an MRT image recording method (e.g., n times, where n is a natural number >1), then act AV follows (e.g., the comparison of the MR spectrum 15 in the nth series with the MR spectrum 15 in the (n-1)th series, by calculating at least one comparison value, which relates at least one information item in the nth series list to at least one information item in the (n-1)th series list). The comparison value includes, for example, subtracting the two areas of the MR spectra 15. Two comparison values may also be calculated (e.g., the respective differences between the ratio of amplitude and width of the fat peak 17 and the water peak 16). A second criterion based on the comparison of two MR spectra 15 recorded directly after one another is added to the abovementioned criterion in act E based on an individual spectrum. The second criterion includes at least one comparison value being higher or lower than a threshold value. The second criterion therefore checks the change between two series. The method may be implemented such that both or just one of the criteria is to be satisfied. A termination criterion may also be defined before the start of the method, for the event that neither the first nor the second criterion is satisfied (e.g., the method may be terminated after n=10 series after act E and may be continued directly with act P).

Figure 2:
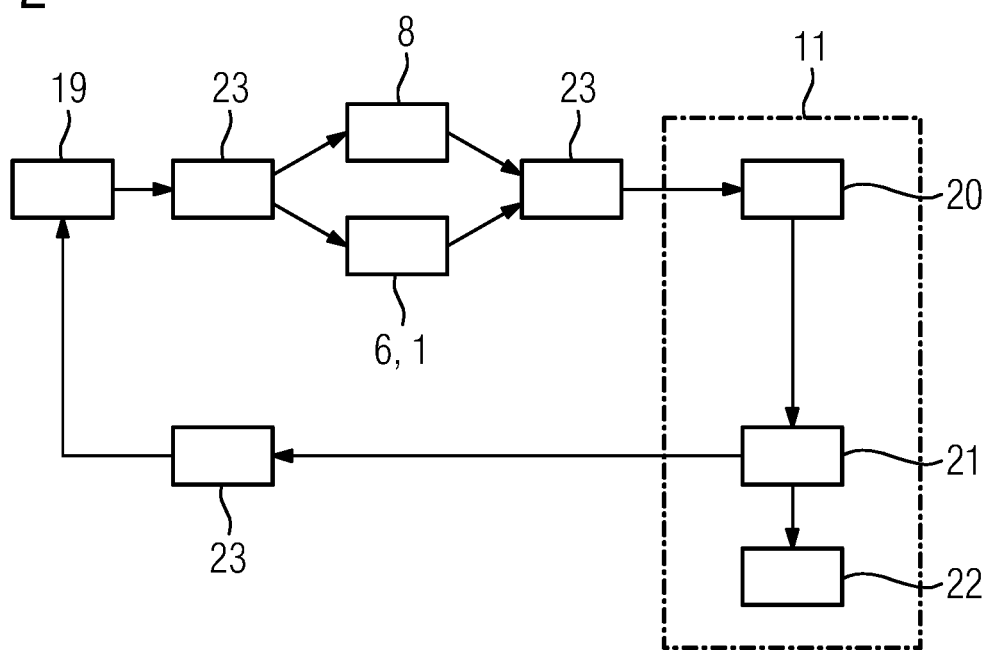
FIG. 2 shows one embodiment of a system for automated spectral fat saturation.

FIG. 2 shows one embodiment of a system for automated spectral fat saturation. The system includes an evaluation unit 11 including an analysis unit 20 configured for the automatic analysis of the MR spectrum 15 according to act A. The system also includes a decision unit 21 configured to make a decision as a function of a predeterminable criterion according to act E. The system includes a calculation unit 22 configured to calculate an HF pulse according to act P. The system also includes a control unit 19 configured to control the MRT device 1, the HF coil 6 and the shim coils 8. The control unit 19 is used for performing act J, adjusting the homogeneity of the static magnetic field $B_0$, and for performing act S, recording an MR spectrum. These units may be configured in the form of both software and hardware. Thus, in the embodiment described, the analysis unit 20, the decision unit 21 and the calculation unit 22 are combined in one evaluation unit 11. The evaluation unit 11 and the control unit 19 are integrated in a data processing unit 19. Interfaces 23 are also used to allow the respective units to communicate with the individual elements of the MRT device 1, the HF coil 6 and the shim coils 8 (and vice versa). The interfaces 11 may be known hardware or software interfaces (e.g., the hardware interfaces PCI bus, USB or Firewire).

Figure 3:
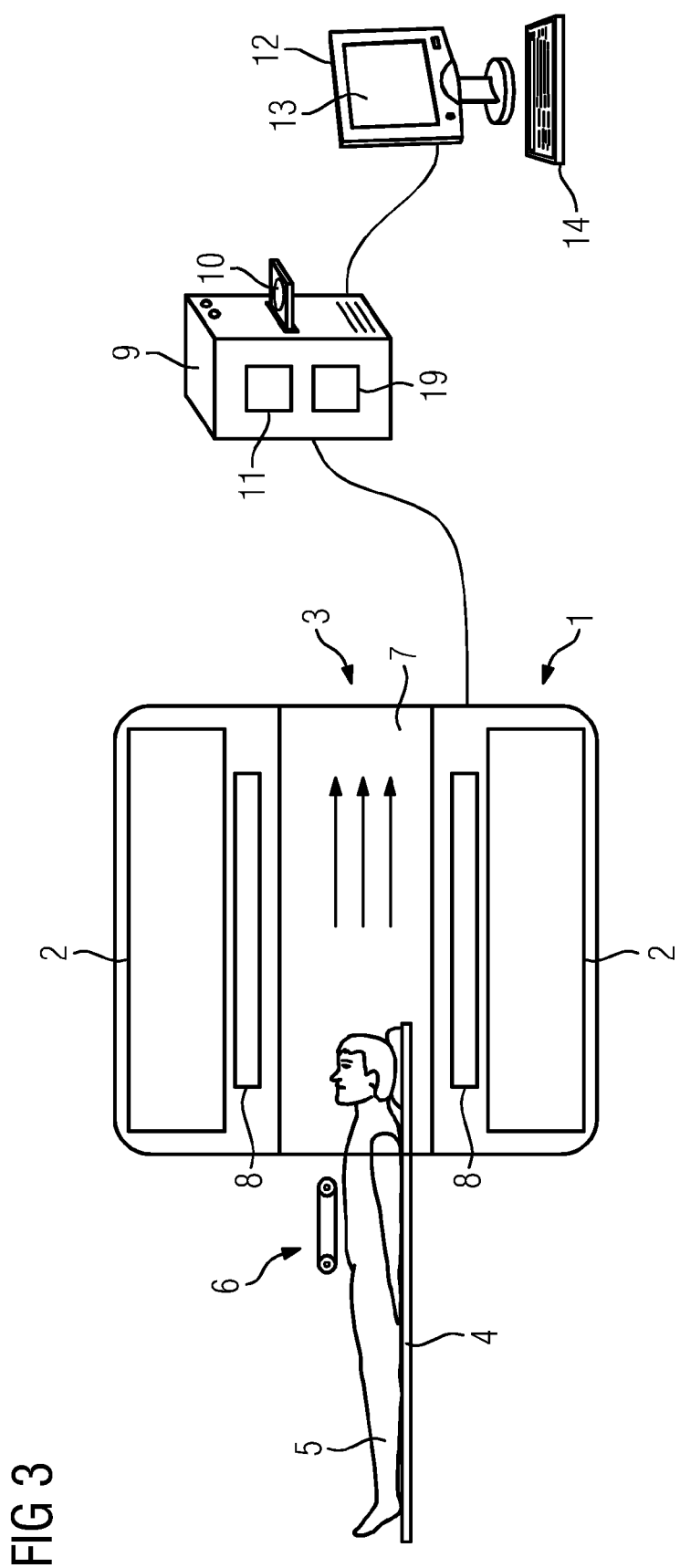
FIG. 3 shows one embodiment of an extended system for automated spectral fat saturation.

FIG. 3 shows one embodiment of an extended system for automated spectral fat saturation in cross-section, including an MRT device 1, a control unit 19, an evaluation unit 11, including an analysis unit 20, a decision unit 21 and a calculation unit 22, and a data processing unit 9 with an input unit 14 and an output unit 13.

The MRT device 1 includes a cryostat 2, in which a magnet made of superconducting material is present. Such a cryostat 2 may be filled with liquid helium to cool the magnet to below transition temperature and bring the magnet to the superconducting state. A superconducting magnet is used to generate a high static magnetic field $B_0$ 7 up to a strength of several Tesla in a large recording volume 3. The cryostat 2 and the magnet may be configured essentially as a hollow cylinder. In a hollow interior of the hollow cylinder, the static magnetic field $B_0$ 7 may be generated. The MRT device 1 also has shim coils 8 in direct proximity to the cryostat 2, enclosing the recording volume 7 and serving to homogenize the static magnetic field $B_0$ 7.

In order to be examined using the MRT device 1, the patient 5 is moved into the recording volume 3 by a patient couch 4. At least one HF coil 6 is used to record a tomographic image of the patient 5 using the MRT device 1. A transmit and receive coil are used, and a single HF coil 6 may be used to transmit and receive. In the embodiment shown, the HF coil 6 is a local coil that only encloses the body region to be imaged. Different local coils exist (e.g., head coils, chest coils, foot coils).

The system also has a data processing unit 9 in the form of a computer as well as an output unit 12 and an input unit 14. The output unit 12 is, for example, one or more LCD, plasma or OLED screens. The input unit 14 is, for example, a keyboard, a mouse, a touch screen or a microphone for speech input.

The evaluation unit 11 and the control unit 19 may also be configured as a computer program product that may be loaded into the memory of the data processing unit 9 with the aid of a computer-readable medium 10. The computer-readable medium 10 is, for example, a DVD, USB stick, hard disk or diskette. The computer program product includes a computer program for executing the method described below for automated spectral fat saturation.

FIG. 4 shows an exemplary output of an MR spectrum 15 with fat peak 17, water peak 16 and a selection window 18. Such a selection window 18 is displayed, for example, at the start of act P, calculation of an HF pulse, on the output unit 12 and allows the operator to use an input unit 14 and a graphical user interface to select the region to be saturated by the HF pulse to be calculated. The frequency profile of the HF pulse may be as square as possible.

Although the invention has been illustrated and described in greater detail on the basis of the exemplary embodiments, the invention is not limited by the disclosed examples. Other variations may be derived herefrom by the person skilled in the art without departing from the scope of protection of the invention. For example, method acts may be performed in a different sequence from the sequences cited.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for automated spectral fat saturation, the method comprising:
   recording a magnetic resonance (MR) spectrum with the aid of a high frequency (HF) coil and a magnetic resonance tomography (MRT) device, a static magnetic field covering a recording volume of the MRT device;
   automatically analyzing the MR spectrum, the analyzing comprising searching for at least two resonant frequencies in the form of a fat peak and a water peak and a minimum between the fat peak and the water peak;
   adjusting the homogeneity of the static magnetic field with the aid of at least one shim coil;
   automatically deciding as to whether the recording, the automatically analyzing, and the adjusting are reperformed, the deciding being a function of a predetermined criterion, wherein the predetermined criterion comprises whether a characteristic value describing the MR spectrum is higher or lower than a threshold value; and
   reperforming the recording, the automatically analyzing, and the adjusting, or calculating an HF pulse for fat saturation based on the deciding, the calculating of the HF pulse for fat saturation comprising calculating the HF pulse for fat saturation as a function of the result of the searching.

2. The method as claimed in claim 1, wherein recording the MR spectrum comprises recording the MR spectrum with the aid of the HF coil.

3. The method as claimed in claim 1, wherein the searching comprises adapting a mathematical function to the MR spectrum.

4. The method as claimed in claim 1, wherein the analyzing comprises creating a list including information, the information comprising spectral position of the water peak and the fat peak and the minimum between the water peak and the fat peak, a characteristic width of the water peak and the fat peak in the MR spectrum, and an amplitude of the water peak and the fat peak in the MR spectrum.

5. The method as claimed in claim 4, wherein the predetermined criterion includes whether at least one information item in the list is higher or lower than at least one threshold value.

6. The method as claimed in claim 4, wherein the series is executed n times, wherein the analyzing comprises, in the nth series, comparing the MR spectrum in the nth series with the MR spectrum in the (n-1)th series, the comparing comprising calculating at least one comparison value that relates at least one information item in the nth series list to at least one information item in the (n-1)th series list.

7. The method as claimed in claim 6, wherein the predetermined criterion includes whether at least one comparison value is higher or lower than a threshold value.

8. The method as claimed in claim 1, wherein calculating the HF pulse for fat saturation comprises calculating the HF pulse for fat saturation as a function of a minimum between the fat peak and the water peak in the MR spectrum.

9. In a non-transitory computer-readable storage medium that stores a computer program with instructions executable by one or more processors for automated spectral fat saturation, the instructions comprising:
    recording a magnetic resonance (MR) spectrum with the aid of a high frequency (HF) coil and a magnetic resonance tomography (MRT) device, a static magnetic field prevailing in a recording volume of the MRT device;
    automatically analyzing the MR spectrum, the analyzing comprising searching for at least two resonant frequencies in the form of a fat peak and a water peak and a minimum between the fat peak and the water peak;
    automatically deciding as to whether a series is performed or whether an act is performed, the deciding being a function of a predetermined criterion;
    adjusting the homogeneity of the static magnetic field with the aid of at least one shim coil; and
    calculating an HF pulse for fat saturation as a function of the result of the searching,
    wherein the series comprises the adjusting, the recording, the analyzing, and the deciding, and wherein the act comprises the calculating, and
    wherein the predetermined criterion comprises whether a characteristic value describing the MR spectrum is higher or lower than a threshold value.

10. The non-transitory computer-readable storage medium as claimed in claim 9, wherein recording the MR spectrum comprises recording the MR spectrum with the aid of the HF coil.

11. The non-transitory computer-readable storage medium as claimed in claim 9, wherein the searching comprises adapting a mathematical function to the MR spectrum.

12. The non-transitory computer-readable storage medium as claimed in claim 9, wherein the analyzing comprises creating a list including information, the information comprising spectral position of the water peak and the fat peak and the minimum between the water peak and the fat peak, a characteristic width of the water peak and the fat peak in the MR spectrum, and an amplitude of the water peak and the fat peak in the MR spectrum.

13. The non-transitory computer-readable storage medium as claimed in claim 12, wherein the predetermined criterion includes whether at least one information item in the list is higher or lower than at least one threshold value.

14. The non-transitory computer-readable storage medium as claimed in claim 12, wherein the series is executed n times,
    wherein the analyzing comprises, in the nth series, comparing the MR spectrum in the nth series with the MR spectrum in the (n-1)th series, the comparing comprising calculating at least one comparison value that relates at least one information item in the nth series list to at least one information item in the (n-1)th series list.

15. The non-transitory computer-readable storage medium as claimed in claim 14, wherein the predetermined criterion includes whether at least one comparison value is higher or lower than a threshold value.

16. The non-transitory computer-readable storage medium as claimed in claim 9, wherein calculating the HF pulse for fat saturation comprises calculating the HF pulse for fat saturation as a function of a minimum between the fat peak and the water peak in the MR spectrum.

17. A system for automated spectral fat saturation, the system comprising:
    a magnetic resonance tomography (MRT) device and a high frequency (HF) coil that are configured to record a magnetic resonance (MR) spectrum, the MRT device being configured to establish a static magnetic field in a recording volume;
    at least one shim coil configured to adjust the homogeneity of the static magnetic field in the recording volume of the MRT device;
    a control unit configured to control the MRT device, the HF coil, and the at least one shim coil;
    an analysis unit configured for automatic analysis of the MR spectrum, the automatic analysis comprising a search for at least two differentiable resonant frequencies in the form of a fat peak, a water peak, and a minimum between the fat peak and the water peak;
    a decision unit configured to make a decision as a function of a predetermined criterion, the decision comprising whether the recordation, the adjustment, and the automatic analysis are to be reperformed; and
    a calculation unit configured to calculate an HF pulse for fat saturation as a function of the search result when the recordation, the automatic analysis, and the adjustment are not to be reperformed, and
    wherein the predetermined criterion comprises whether at least one comparison value is higher or lower than a threshold value.

* * * * *